(12) United States Patent
Lin et al.

(10) Patent No.: US 12,068,376 B2
(45) Date of Patent: Aug. 20, 2024

(54) METAL FIELD PLATES

(71) Applicant: Taiwan Semiconductor Manufacturing Company Limited, Hsinchu (TW)

(72) Inventors: Chien-Hung Lin, Hsinchu (TW); Tsai-Hao Hung, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 195 days.

(21) Appl. No.: 17/394,476

(22) Filed: Aug. 5, 2021

(65) Prior Publication Data
US 2023/0045468 A1   Feb. 9, 2023

(51) Int. Cl.
*H01L 29/40* (2006.01)
*H01L 21/8249* (2006.01)
*H01L 27/06* (2006.01)

(52) U.S. Cl.
CPC ........ *H01L 29/402* (2013.01); *H01L 21/8249* (2013.01); *H01L 27/0623* (2013.01); *H01L 29/401* (2013.01)

(58) Field of Classification Search
CPC ............... H01L 29/402; H01L 21/8249; H01L 27/0623; H01L 29/401; H01L 29/6653; H01L 29/66659; H01L 29/1083; H01L 27/088; H01L 29/7835; H01L 21/823892; H01L 21/823821; H01L 27/0924
See application file for complete search history.

(56) References Cited

U.S. PATENT DOCUMENTS

| 9,142,555 | B2 * | 9/2015 | Yoshida | H01L 24/40 |
| 2008/0061368 | A1 * | 3/2008 | Williams | H01L 29/7825 257/E29.054 |
| 2013/0009253 | A1 * | 1/2013 | Wang | H01L 27/0629 438/237 |
| 2016/0099242 | A1 | 4/2016 | Mallikarjunaswamy | |
| 2022/0406903 | A1 * | 12/2022 | Wang | H01L 29/7835 |

FOREIGN PATENT DOCUMENTS

| TW | 202038302 A | 10/2020 |
| TW | 1726348 B | 5/2021 |

OTHER PUBLICATIONS

Taiwan Patent Office; Application No. 111111208 Office Action mailed Mar. 8, 2023, 6 pages.

* cited by examiner

*Primary Examiner* — Shouxiang Hu
(74) *Attorney, Agent, or Firm* — The Marbury Law Group, PLLC

(57) ABSTRACT

Integrated semiconductor devices and method of making the integrated semiconductor are disclosed. The integrated semiconductor device may include a first transistor comprising a first gate and at least one first active region, a second transistor comprising a second gate and at least one second active region, wherein the second transistor is spaced a first distance from the first transistor, a dielectric sidewall spacer formed on a gate sidewall of the first transistor and a gate sidewall of the second transistor, a first dielectric layer formed over the first transistor and the second transistor, wherein a thickness of the first dielectric layer is greater than half the first distance, and a patterned metal layer formed on the first dielectric layer and partially covering the second gate.

20 Claims, 12 Drawing Sheets

METAL FIELD PLATES

BACKGROUND

Field plates are used in with metal oxide field effect transistors (MOSFET) to manipulate and reshape electric field distribution to reduce the maximum electric field of these transistors when high voltages are applied to the drain electrode. The field plate is typically made of metal and at least partially covers the gate electrode. By reducing the maximum electric field, field plates increase the breakdown voltage and therefore achieve operations at higher voltages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
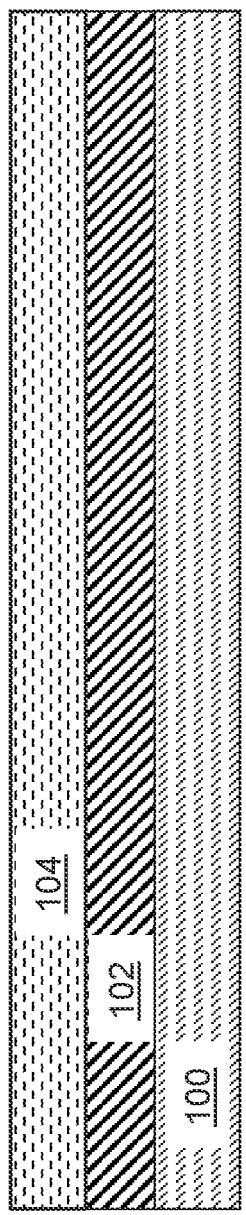
FIG. 1 is a vertical cross-sectional view illustrating depositing an epilayer on a substrate and a buried layer over the epilayer in a method of making an integrated semiconductor device according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to semiconductor devices, and specifically to semiconductor devices that include metal field plates. Embodiments include, but are not limited to, Bipolar/CMOS/DMOS (BCD) devices. For example, Bipolar-CMOS-DMOS (BCD) devices may include a bipolar region, a complementary metal oxide semiconductor (CMOS) region, and a double diffused metal oxide semiconductor (DMOS) region. The bipolar region may include bipolar junction transistors, to perform precise analog functions. The CMOS region may include complementary metal oxide semiconductor field effect transistors (MOSFETs) to perform digital functions. The DMOS region may include power and high-voltage elements to provide power and any high-voltage elements. The use of a metal field plate in conjunction with a BCD device may reshape electric field distribution to reduce the maximum electric field of the transistors in a BCD device when high voltages are used. To increase device breakdown voltage of the DMOS transistor, a metal field plate may be added on an inter-layer dielectric (ILD) layer that covers a gate electrode, so as to reduce feedback capacitance between the active regions and the gate. The field plate may partially or totally cover the gate electrode. The use of a metal field plate may reshape electric field distribution to reduce the maximum electric field of the transistors in a BCD device when high voltages are used.

However, as transistors get smaller and closer together, fabrication of the metal field plates may result in residue metal located between adjacent transistors. The residue metal may increase the "on" resistance which consequently increases power consumption of the device. The residual metal is often located in a deep v-channel formed in a dielectric layer that if difficult to reach and remove using conventional etching techniques. One solution to mitigate or eliminate the residue metal from the formation of a metal field plate is to increase the distance between adjacent transistors. By increasing the distance between adjacent transistors, any residual metal left over from the formation of a metal field plate may be etched away. However, this solution results in a lower areal density.

Various embodiments are disclosed herein that provide for the fabrication of an integrated semiconductor device that may implement a metal field plate in which the distance between adjacent transistors of the semiconductor device may be minimized. The various embodiments may also eliminate residue metal due to the formation of the metal field plate. In particular, various embodiments are disclosed in which a thickness of the dielectric layer immediately overlaying adjacent transistors is at least as thick as half the distance between the adjacent transistors. By providing a dielectric layer overlaying the adjacent transistors with a sufficient thickness the residual metal may be eliminated. Thus, metal field plates may be formed without sacrificing areal density.

In various embodiments, the thickness of a dielectric layer located over adjacent transistors may be more than half the distance between the adjacent transistors. In various embodiments, the addition of the metal field plates and control of the distance between adjacent transistors results in lowering the "on" resistance by 15-35% relative to similar device lacking metal field plates. The lower on resistance may result in lower power consumption. In addition, the lower on resistance may allow for smaller device pitch. Smaller device pitch may result in a smaller chip size for the same number of devices on a chip. In various embodiments, the transistors may comprise FinFETs.

Referring to FIG. 1, an epilayer 102 may be formed over a substrate 100. In various embodiments, the substrate 100 may include an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. Furthermore, the semiconductor substrate 100 may be a semiconductor on insulator, such as a silicon on insulator (SOI). In various embodiments, the epilayer 102 may be a p-type epilayer, such as a p-type silicon epilayer or any other suitable p-type material. In various embodiments, a buried layer 104, such as an n-type buried layer, may be formed over the epilayer 102. The n-type buried layer 104 may be n-type silicon or any other suitable n-type material. The epilayer 102 may be formed by vapor phase epitaxy (VPE), molecular beam epitaxy (MBE), atomic layer deposition (ALD) or any other suitable method. The buried layer 104 may be formed by chemical vapor deposition (CVD), plasma enhanced chemical vapor deposition (PECVD) or ALD.

Figure 2:
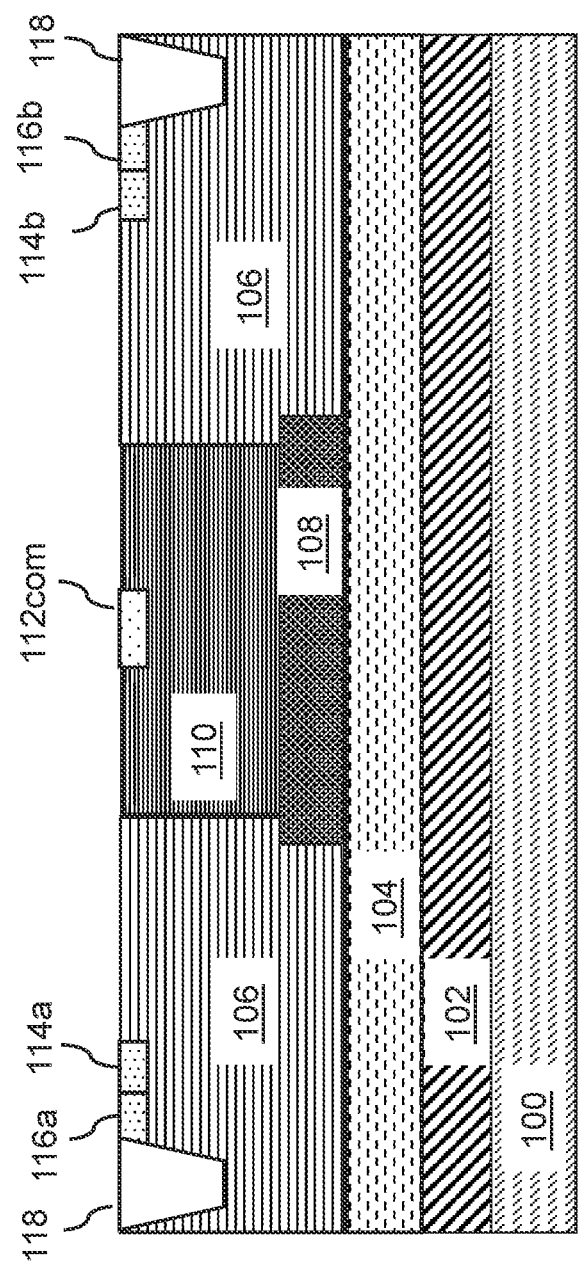
FIG. 2 is a vertical cross-sectional view illustrating forming p-type regions, a deep well region, an n-type region shallow trench isolation structures and active regions on the intermediate device illustrated in FIG. 1 in a method of making an integrated semiconductor device according to an embodiment of the present disclosure.

Referring to FIG. 2, a deep well 108, e.g., a deep p-type well, may be formed over the buried layer 104. A high voltage n-type well 110 (HVW), may be formed over the deep well 108. The deep well 108 may be formed by depositing a layer of p-type material over the buried layer 104 and then subsequently etching and pattering the deep well 108. The high voltage n-type well 110, as well as p-type regions 106 disposed on either side of the high voltage n-type well 110, may be formed by first depositing a continuous layer of semiconductor material, such silicon. Next, the continuous layer of semiconductor material may be covered with a photoresist layer (not shown) which is then patterned. The patterned photoresist layer may then be used as a mask for ion implantation. The p-type regions 106 and the high voltage n-type well 110 may be formed in any order. That is, the p-type regions 106 may be formed while the portion of the continuous layer of semiconductor material to be the high voltage n-type well 110 is masked. Followed by masking the p-type regions 106 and forming the high voltage n-type well 110. Alternatively, the order of forming the p-type regions 106 and the high voltage n-type well 110 may be reversed.

Next, shallow trench isolation structures 118 may be formed in the p-type regions 106. The shallow trench isolation structures 118, may be formed by first forming a trench in the p-type regions 106 and filling the trench with a dielectric material, such as SiO$_2$. Other suitable dielectric materials are within the contemplated scope of disclosure. Active regions 112com, 114a, 114b, 116a, 116b (e.g. source/drain regions) may be formed by masking the top surface of the p-type regions 106 and the high voltage n-type well 110 and performing respective ion implantation operation until the respective active regions 112com, 114a, 114b, 116a, 116b (e.g. source/drain regions) may be formed. As discussed in more detail below, active region 112com may be a common active region between adjacent transistors. Active regions 114a and 114b may serve as a source/drain to adjacent transistors 120a and 120b, respectively. Active regions 116a and 116b may as a source/drain to other transistors (not fully shown).

Figure 3:
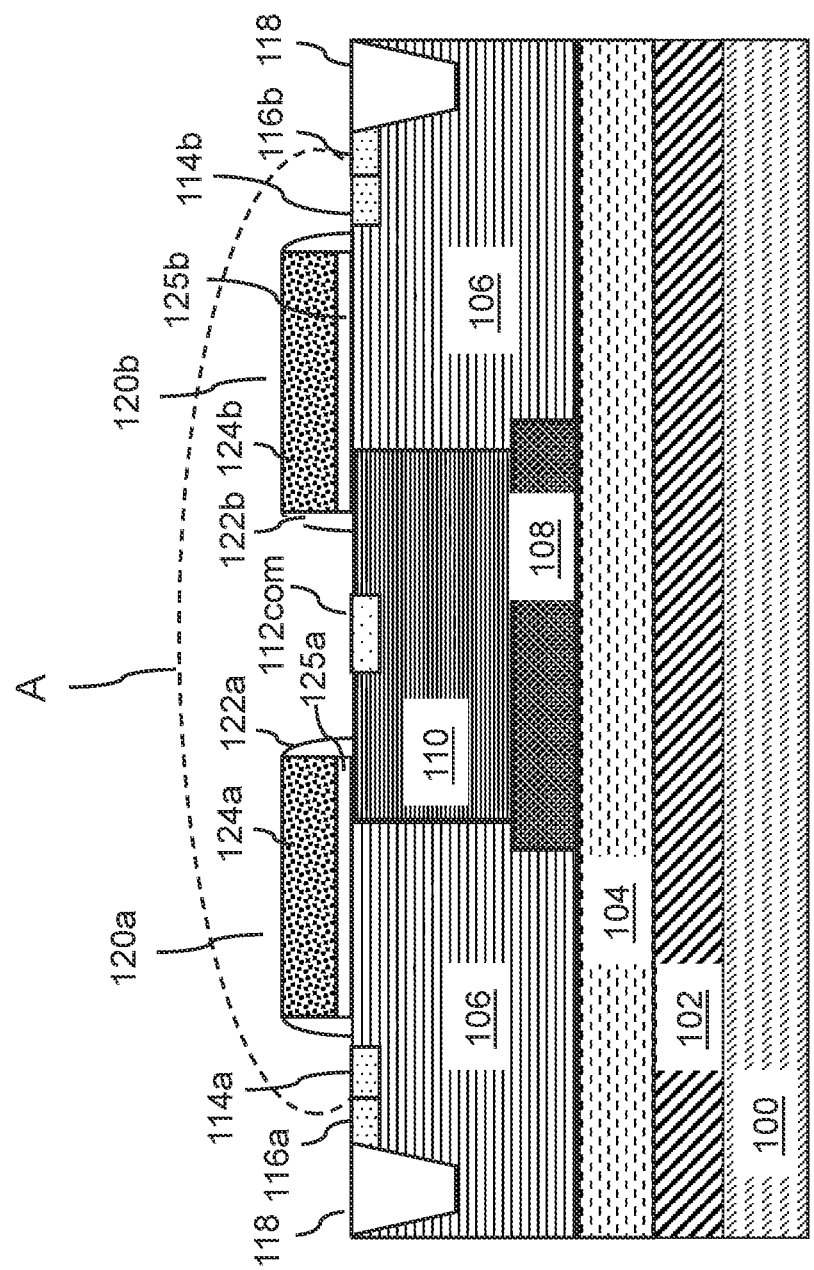
FIG. 3 is a vertical cross-sectional view illustrating completing transistors on the intermediate structure illustrated in FIG. 2 in a method of making an integrated semiconductor device according to an embodiment of the present disclosure.

Referring to FIG. 3, first transistor 120a and second transistor 120b may be formed adjacent to one another. First transistor 120a and second transistor 120b may be completed by forming a gate stacks including respective gate oxide 125a, 125b and respective gate 124a, 124b located above the p-type regions 106 and the high voltage n-type well 110. Respective sidewall spacers 122a, 122b may then be formed on the sidewalls of each respective gate stacks (125a, 124a and 125b, 124b). In an alternative embodiment, the gate oxides 125a, 125b, the gates 124a, 124b and the sidewall spacers 122a, 122b may be formed prior to forming the active regions 112com, 114a, 114b, 116a, 116b, active region 112com being a common active region for first transistor 120a and second transistor 120b. In this manner, the active region 114a, 114b may be self-aligned to the gate stack.

In an embodiment, the integrated semiconductor device may have a first transistor 120a with a first source/drain 112com, a first source/drain 114a and a first gate 124a and a second transistor 120b with a second source/drain 112com, a second source/drain 114b and a second gate 124b. Additional embodiments discussed in more detail below may include additional transistors, such as a third transistor with a third source, a third drain and a third gate. The first and second gates 124a, 124b may be formed from a conductive metal material such as Al, Cu, W, Ti, Ta, TiN, TaN, NiSi, CoSi. Other suitable conductive materials or combinations thereof are within the contemplated scope of disclosure.

Figure 4:
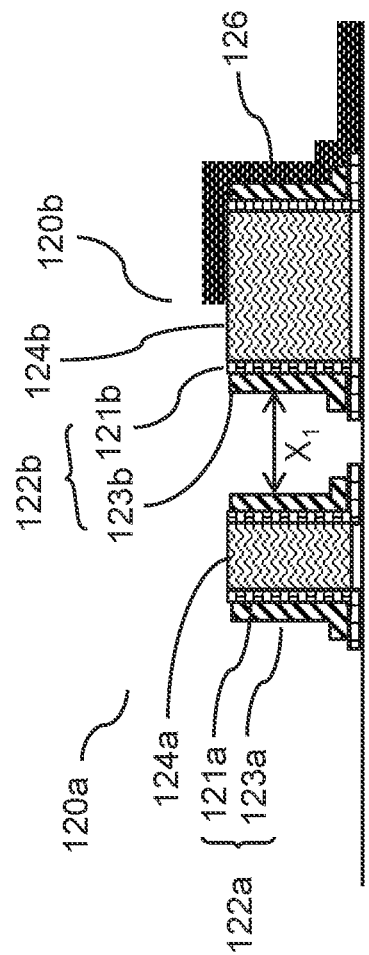
FIG. 4 is a vertical cross-sectional close up view illustrating forming a metal field plate oxide over a sidewall and portion of the gate of one of the transistors on the intermediate structure illustrated in FIG. 3 in a method of making an integrated semiconductor device according to an embodiment of the present disclosure.

FIG. 4 illustrates the portion labeled "A" in FIG. 3 that includes adjacent transistors 120a and 120b. Referring to FIG. 4, in an embodiment, the sidewall spacers 122a, 122b of the transistors 120a, 120b may include a first spacer layer 121a, 121b comprising silicon nitride and a second spacer layer 123a, 123b comprising silicon oxide. In an embodiment, a resist protect oxide (RPO) 126 may be formed over a portion of the gate 124b of second transistor 120b, the sidewall spacers 122b and a portion of the p-type regions 106. The RPO layer 126 may be formed by depositing a layer of oxide material, such as SiO$_2$ or any suitable oxide and then patterning the oxide layer such that the remaining oxide material covers a portion of the second transistor 120b and the p-type region 106. Typically, the RPO layer 126 may be deposited prior to siliciding. The portion of the intermediate device covered by the RPO layer 126 may be protected from siliciding by the RPO layer during the siliciding process. The RPO layer may be formed by chemical vapor deposition, plasma enhanced chemical vapor deposition, atomic layer deposition or any other suitable method. Also illustrated in FIG. 4 is a first distance X1 between a first pair of adjacent first transistor 120a and second transistor 120b. As illustrated in FIG. 4, the distance between adjacent first transistor 120a and second transistor 120b may be measured from sidewall spacer 122a to sidewall spacer 122b. The distance X (e.g., X1, X2) may define the distance between any two adjacent transistors.

Figure 5:
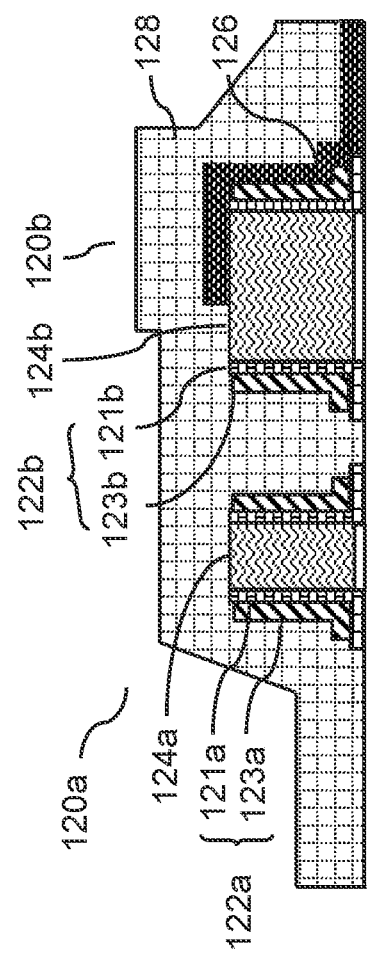
FIG. 5 is a vertical cross-sectional view illustrating depositing an dielectric layer over the intermediate structure illustrated in FIG. 4 in a method of making an integrated semiconductor device according to an embodiment of the present disclosure.

Referring to FIG. 5, a metal field plate bottom dielectric layer 128 (also referred to herein as a first dielectric layer 128) may be deposited over the intermediate structure illustrated in FIG. 4. The metal field plate bottom dielectric layer 128 may be made of any suitable dielectric material, such as SiO$_2$, SiC, SiON, SiN, boro-phospho-silicate Glass (BPSG), PSG (phosphosilicate glass; phosphorus doped silicon glass), TEOS (tetraethoxysilane; tetraethylorthosilicate; tetrethoxysilicide), and/or combinations thereof. The metal field plate bottom dielectric layer 128 may be formed by chemical vapor deposition, plasma enhanced chemical vapor deposition, atomic layer deposition or any other suitable method.

Figure 6:
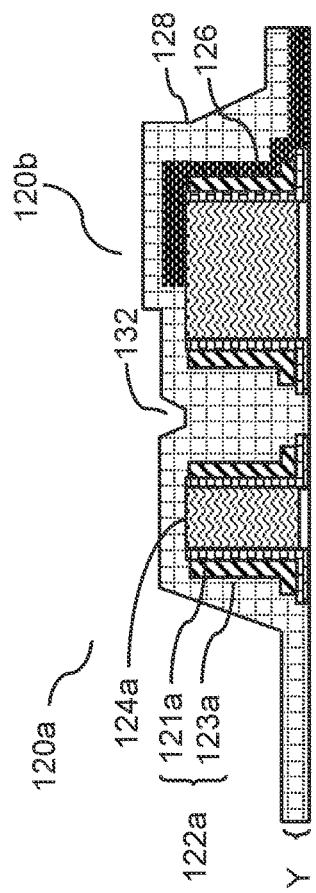
FIG. 6 is a vertical cross-sectional view illustrating the oxide layer over the intermediate structure illustrated in FIG. 5 in a method of making an integrated semiconductor device according to an embodiment of the present disclosure.

Referring to FIG. 6, the metal field plate bottom dielectric layer 128 may be etched. As indicated in FIG. 6, the metal field plate bottom dielectric layer 128 may be etched to a thickness Y. As a result of the etching of the metal field plate bottom oxide layer 128, a trench 132 may form between adjacent first transistor 120a and second transistor 120B. The thickness Y of the metal field plate bottom dielectric layer 128 may be in the range of 1 Å-10,000 Å, such as 10 Å-1000 Å, although greater or lesser thicknesses may be used depending on the distance X between adjacent transistors. The dimensions of the trench 132 may vary depending on the thickness of the metal field plate bottom dielectric layer 128, the distance X between adjacent transistors, as well as the height of the adjacent transistors. As the height of the adjacent transistors increases, the depth of the trench 132 may also increase. Moreover, as the distance X between adjacent transistors increases, the depth of the trench 132 that may be formed also increases. As a result, the likelihood of residual metal occurring in trench 132 increases. Thus, as discussed in greater detail below with respect to FIG. 8, the thickness Y of the metal field plate bottom dielectric layer 128 may be a function of the distance X between adjacent transistors.

Figure 7:
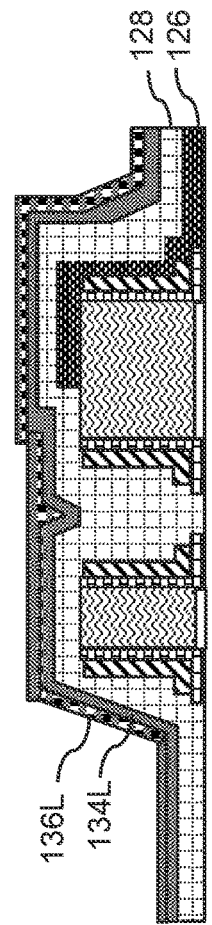
FIG. 7 is a vertical cross-sectional view illustrating depositing a continuous metal layer and a continuous dielectric layer over the intermediate structure illustrated in FIG. 6 in a method of making an integrated semiconductor device according to an embodiment of the present disclosure.

Referring to FIG. 7, a continuous metal layer 134L may be deposited over the metal field plate bottom dielectric layer 128. In various embodiments, the continuous metal layer 134L may be made of Ti, TiN, Ta, TaN or a combinations thereof. Other suitable metal materials for the continuous metal layer are within the contemplated scope of disclosure. The thickness of the continuous metal layer 134L may be in the range of 1 Å-10,000 Å, such as 10 Å-1000 Å, although greater or lesser thicknesses may be used.

Next, a continuous metal field plate top dielectric layer 136L (also referred to herein as a second dielectric layer 136) may be deposited over the continuous metal layer 134L. The continuous metal field plate top dielectric layer 136L may be made of any suitable dielectric material, such as SiO$_2$, SiC, SiON, SiN, boro-phospho-silicate Glass (BPSG), PSG (phosphosilicate glass; phosphorus doped silicon glass), TEOS (tetraethoxysilane; tetraethylorthosilicate; tetraethylorthosilicate; tetrethoxysilicide), and/or combinations thereof. Other suitable oxide materials are within the contemplated scope of disclosure. The continuous metal field plate top dielectric layer 136L may be formed by chemical vapor deposition, plasma enhanced chemical vapor deposition, atomic layer deposition or any other suitable method. The thickness of the metal field plate top dielectric layer 136L may be in the range of 1 Å-10,000 Å, such as 10 Å-1000 Å, although greater or lesser thicknesses may be used.

Figure 8:
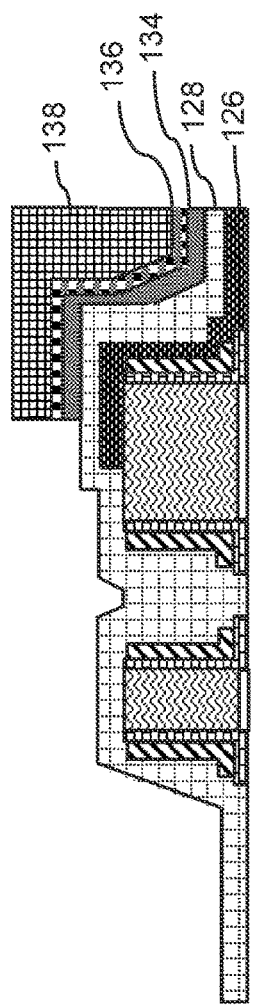
FIG. 8 is a vertical cross-sectional view illustrating etching the continuous metal layer and the continuous dielectric layer over the intermediate structure illustrated in FIG. 7 in a method of making an integrated semiconductor device according to an embodiment of the present disclosure.

Referring to FIG. 8, the continuous metal field plate top dielectric layer 136L and the continuous metal layer 134L may be patterned. Patterning may be accomplished by depositing a photoresist layer 138 layer over the continuous metal field plate top dielectric layer 136L and patterning the photoresist layer 138. The patterned photoresist layer 138 may be used as a mask to protect the continuous metal field plate top dielectric layer 136L and the continuous metal layer 134L during an etch process. In doing so, a patterned metal field plate top dielectric layer 136 and a patterned metal layer 134 may be formed and the metal field plate over a portion of the second transistor 120b may be completed. However, if the distance X between adjacent transistors 120a, 120b is greater than or equal to twice (i.e., 2 times) the thickness Y of the metal field plate bottom dielectric layer 128, some residue of the continuous metal layer 134L may remain in the trench 132 subsequent to the etch process that forms patterned metal field plate top dielectric layer 136 and patterned metal layer 134. Accordingly, with reference to FIG. 6, the various embodiments disclosed herein include a metal field plate bottom dielectric layer 128 that may be etched such that the thickness Y of the metal field plate bottom dielectric layer 128 is greater than or equal to half the distance X between adjacent first transistor 120a and second transistor 120b (i.e., Y≥X/2). By etching the metal field plate bottom dielectric layer 128 (see FIG. 6) such that the resulting metal field plate bottom dielectric layer 128 has a sufficient thickness, the residual metal formed in the trench 132 may be eliminated regardless of the distance between adjacent transistors (e.g., 120a and 120b).

Figure 9:
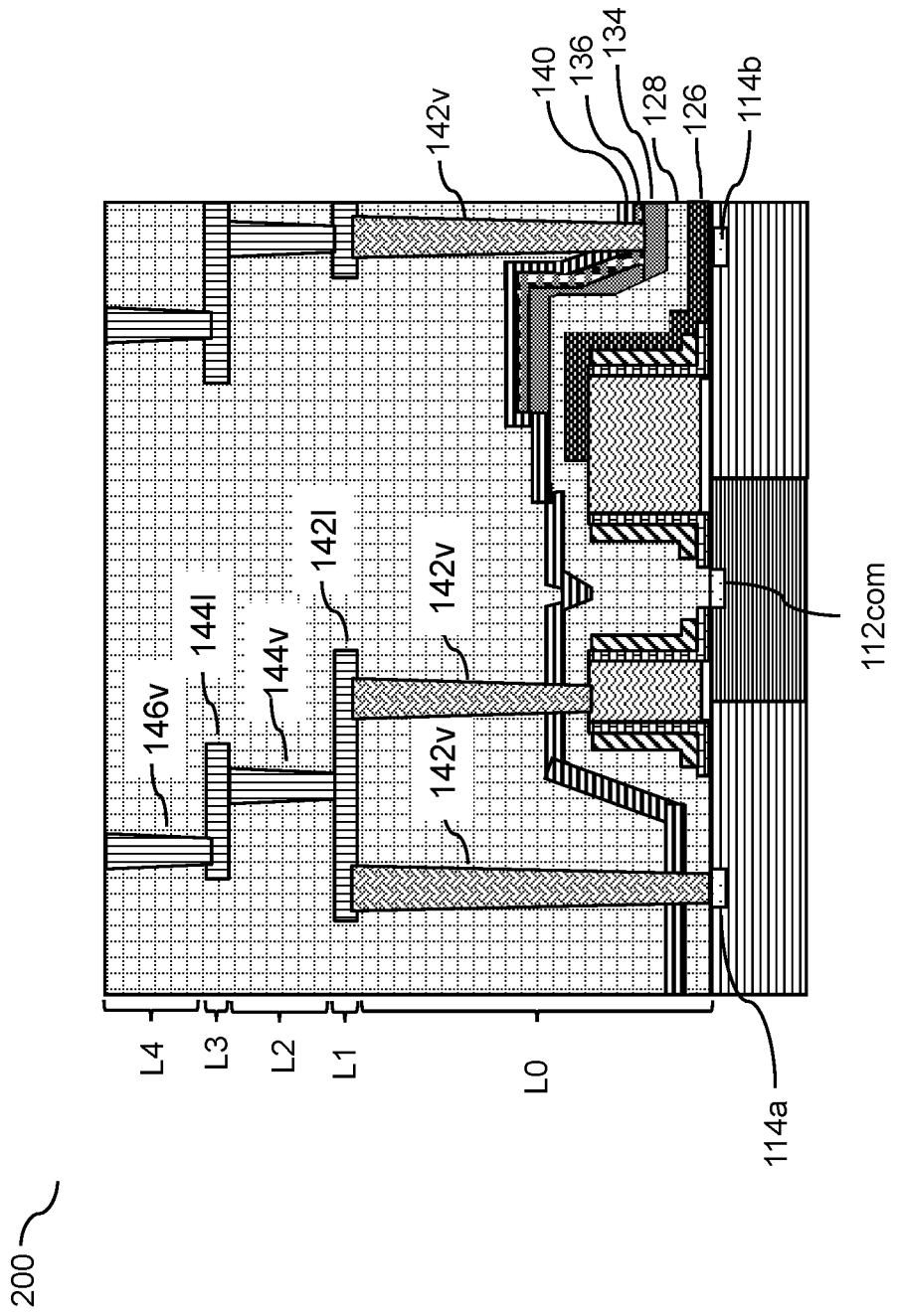
FIG. 9 is a vertical cross-sectional view illustrating forming contact structures and interconnect-level structures over the intermediate structure illustrated in FIG. 6 in a method of making an integrated semiconductor device according to an embodiment of the present disclosure.

Referring to FIG. 9, a contact etch stop layer 140 may be deposited over the intermediate structure illustrated in FIG.

8. The contact etch stop layer 140 may be deposited over the metal field plate bottom dielectric layer 128 (i.e., first dielectric layer 128) and the metal field plate top dielectric layer 136 (i.e., second dielectric layer 136). The contact etch stop layer 140 may be made of silicon nitride, silicon oxynitride or any other suitable material and may have a thickness in the range of 1 Å-1,000 Å, such as 10 Å-1000 Å, although greater or lesser thicknesses may be used. The contact etch stop layer 140 may be deposited by chemical vapor deposition, plasma enhanced chemical vapor deposition, atomic layer deposition or any other suitable method. In the various embodiments in which the thickness Y of the metal field plate bottom dielectric layer 128 is greater than or equal to half the distance X between adjacent first transistor 120a and second transistor 120b (i.e., Y≥X/2), all of the patterned metal layer 134 may be etched away such that no residual metal layer 134 remains in the trench 132. Thus, the contact etch stop layer 140 may be formed directly on the metal field plate bottom dielectric layer 128 (i.e., first dielectric layer 128) between the adjacent transistors (e.g., 120a, 120b, 120c).

Next, oxide material may be deposited over the contact etch stop layer 140 to complete an initial ILD layer structure L0. Via holes (not shown) may be etched in the initial ILD layer L0 and subsequently filled with a conductive metal material to form contact via structures 142v. Additional ILD layer structures L1, L2, L3, L4 may then be fabricated as desired. The first level ILD layer structure L1 may include first metal lines 142l formed therein. The second level ILD layer structure L2 may include second level via structures 144v formed therein. The third level ILD layer structure L3 may include second metal lines 144l formed therein. The fourth ILD layer structure L4 may include third level via structures 146v formed therein. The result is an integrated semiconductor device 200. Additional ILD layer structures may be added as desired. Each of the ILD layers L0-L4 may be formed of a suitable dielectric material. Each of the ILD layers L0-L4 may be may made of the same or different dielectric materials.

Figure 10:
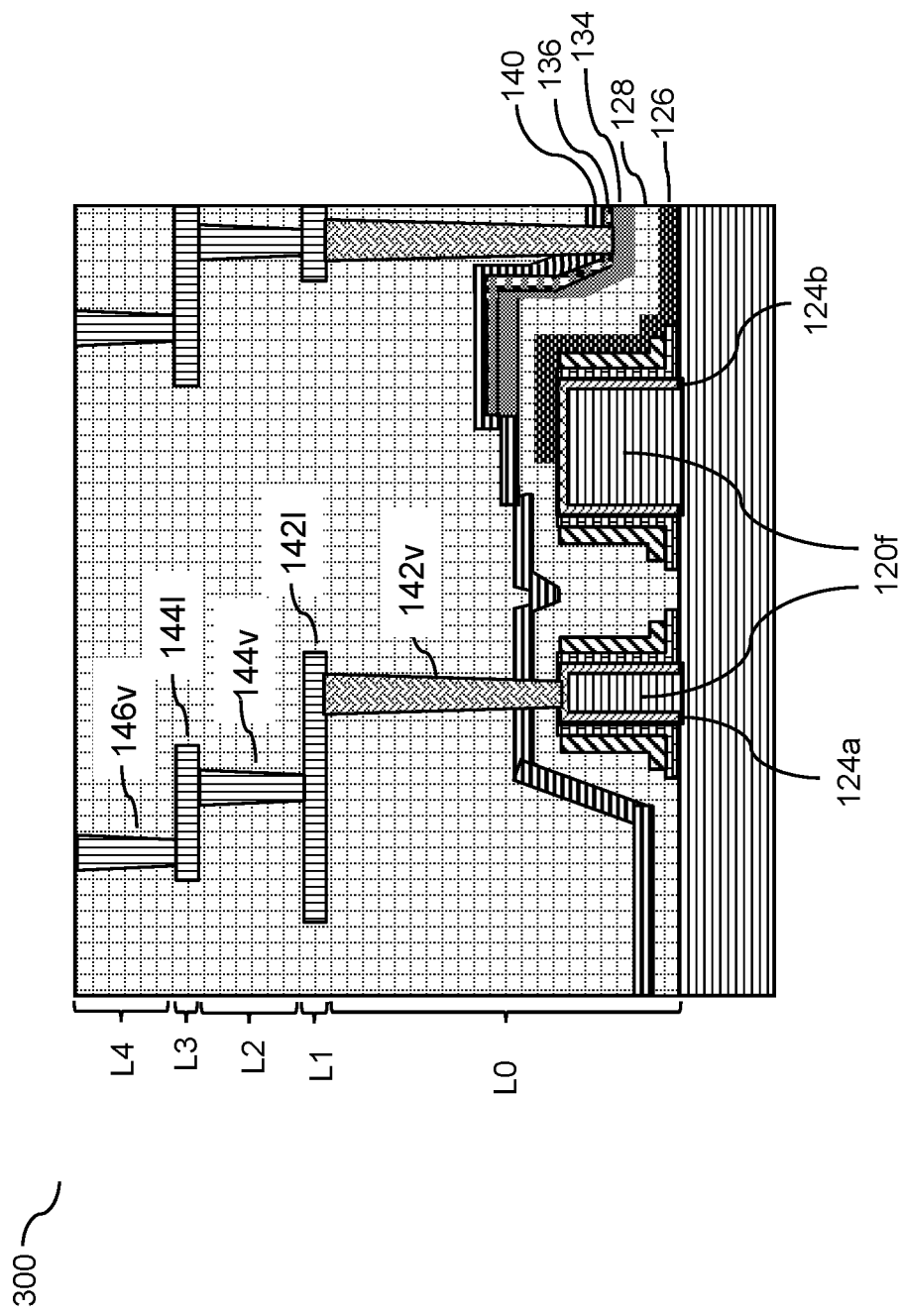
FIG. 10 is a vertical cross-sectional view illustrating an integrated semiconductor device comprising fin field effect transistors (FinFETs) according to an alternative embodiment of the present disclosure.

Referring to FIG. 10, an alternative integrated semiconductor device 300 is illustrated. In the alternative embodiment integrated semiconductor device 300, the transistors 120a and 120b as shown in integrated semiconductor device 200 may be replaced with fin field-effect transistors (FinFETs) 120f. A FinFET is a field effect transistor in which the channel may be in the shape of a fin and the gate may be located on three sides, e.g. on the top and along two sidewalls, of the channel. FinFETs, are non-planar in that the fin shape of the channel protrudes from the surface of the substrate. Thus, the added height of the fin may affect the overall height of the device which, in turn, may affect how close adjacent FinFET transistors may be fabricated in accordance with the various embodiments disclosed herein. As the height of the FinFET transistors is increased in a vertical direction, the lateral distance between adjacent transistors in which a field metal plate is employed may impact the thickness of an overlying dielectric layer in order to mitigate residue metal used to form the field metal plate in accordance with various embodiments disclosed herein. As the height of the adjacent transistors increases, the depth of the trench 132 may also increase. Moreover, as the distance X between adjacent transistors increases, the depth of the trench 132 that may be formed also increases. Thus, in order to mitigate against subsequent residual metal in a trench, the thickness Y of the metal field plate bottom dielectric layer 128 may be increased to mitigate against the condition in which subsequently deposited metal may remain in a trench 132 formed in metal field plate bottom dielectric layer 128.

Figure 11:
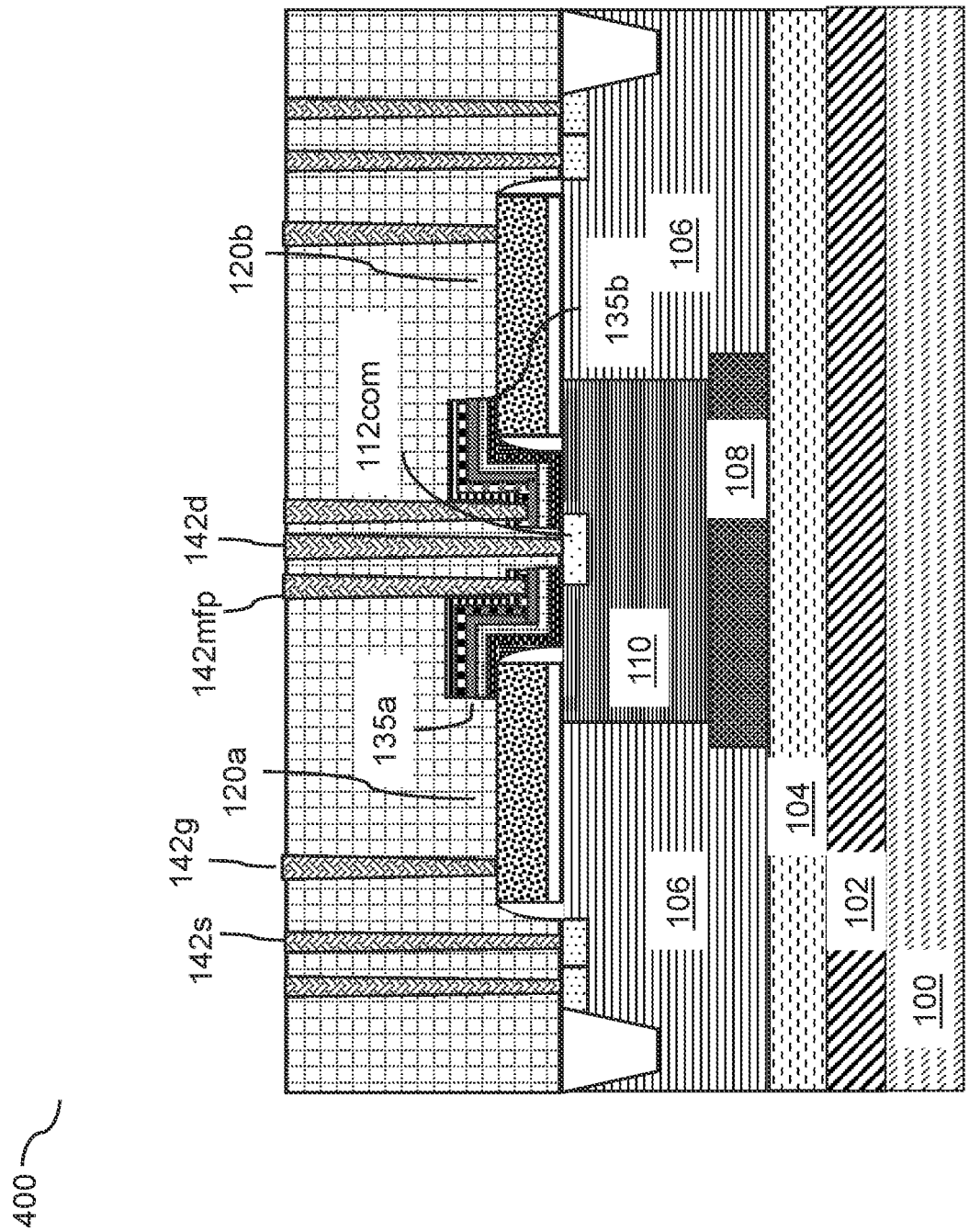
FIG. 11 is a vertical cross-sectional view illustrating an integrated semiconductor BCD device comprising adjacent transistors with contact field plates in a high voltage region according to an alternative embodiment of the present disclosure.

Referring to FIG. 11, another alternative embodiment integrated semiconductor device 400 is illustrated. In this alternative embodiment, adjacent transistors 120a, 120b have respective patterned stack layers 135a, 135b (stack of conductive field plate layers) located adjacent the same, common active region 112com, e.g. a drain region. The patterned stack layers 135a 135b may be part of a stack of layers such as illustrated in previous embodiments, i.e. an RPO layer 126, a first dielectric layer 128, patterned metal layer 134, second dielectric layer 136 and contact etch stop layer 140. Note, the labels for the RPO layer 126, a first dielectric layer 128, second dielectric layer 136 and contact etch stop layer 140 are not provided to improve clarity of the figure. Also illustrated are contact via structures 142s, 142g, 142d and 142mfp for the source, gate, drain and metal field plate respectively. The addition of the patterned stack layers 134 lowers the "on" resistance by 15-35%, such as 20-30% relative to similar device lacking conductive field plates. The lower on resistance may result in lower power consumption as well as allowing for smaller device pitch. Smaller device pitch may result in a smaller chip size for the same number of devices on a chip.

Figure 12A:
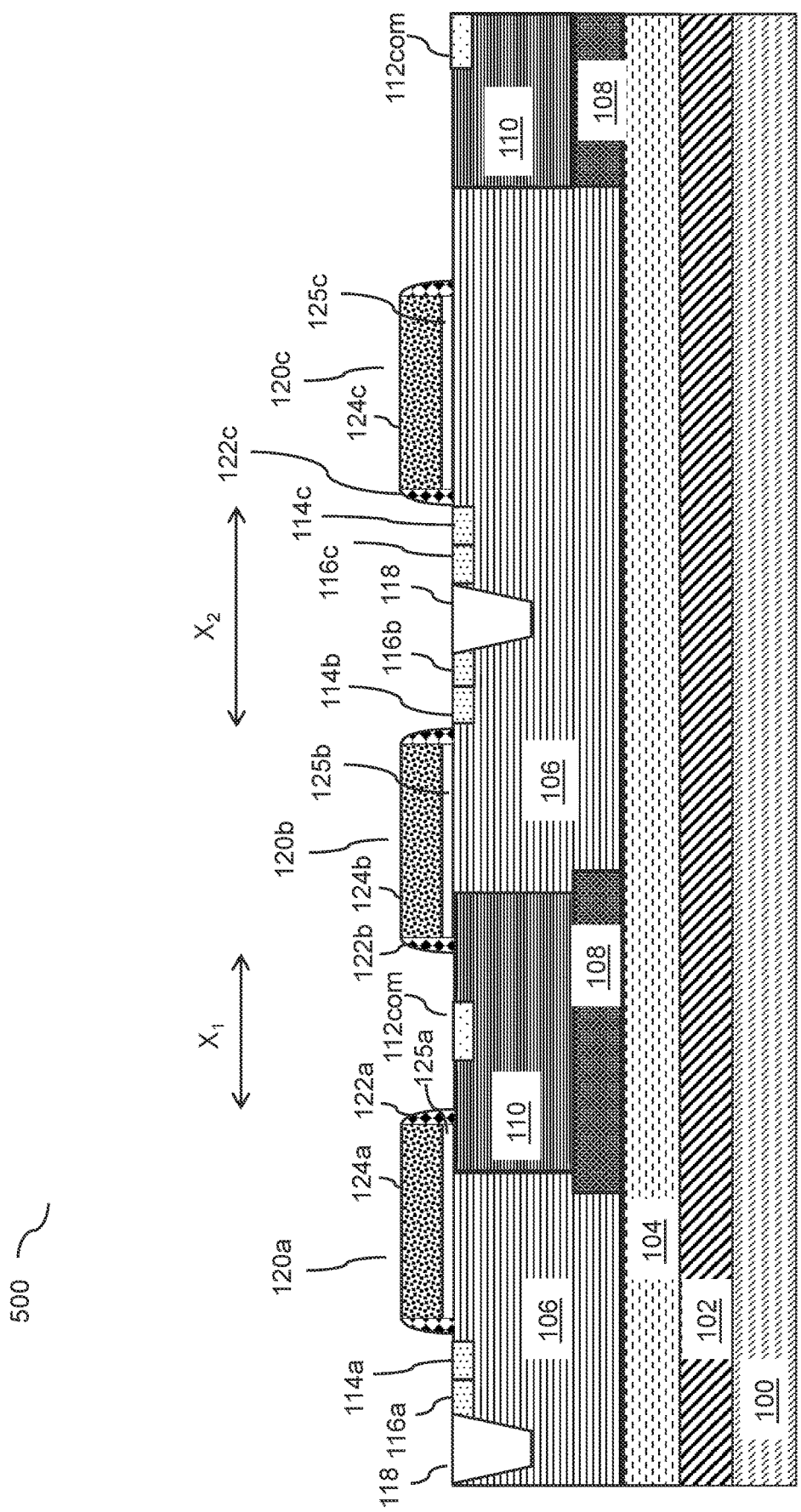
FIG. 12A is a vertical cross-sectional view illustrating an integrated semiconductor device with three transistors according to an alternative embodiment of the present disclosure.

Referring to FIG. 12A, another alternative embodiment integrated semiconductor device 500 is illustrated. In this alternative embodiment, an additional third transistor 120c is illustrated. The third transistor 120c may include active regions 114c, 116c, and another common active region 112com. The third transistor 120c may also include third sidewall spacers 122c, a third gate 124c and a third gate oxide layer 125c. A second distance X2 may be defined as the distance between the second transistor 120b and the third transistor 120c as measured from the second sidewall spacers 122b to the third sidewall spacers 122c.

Figure 12B:
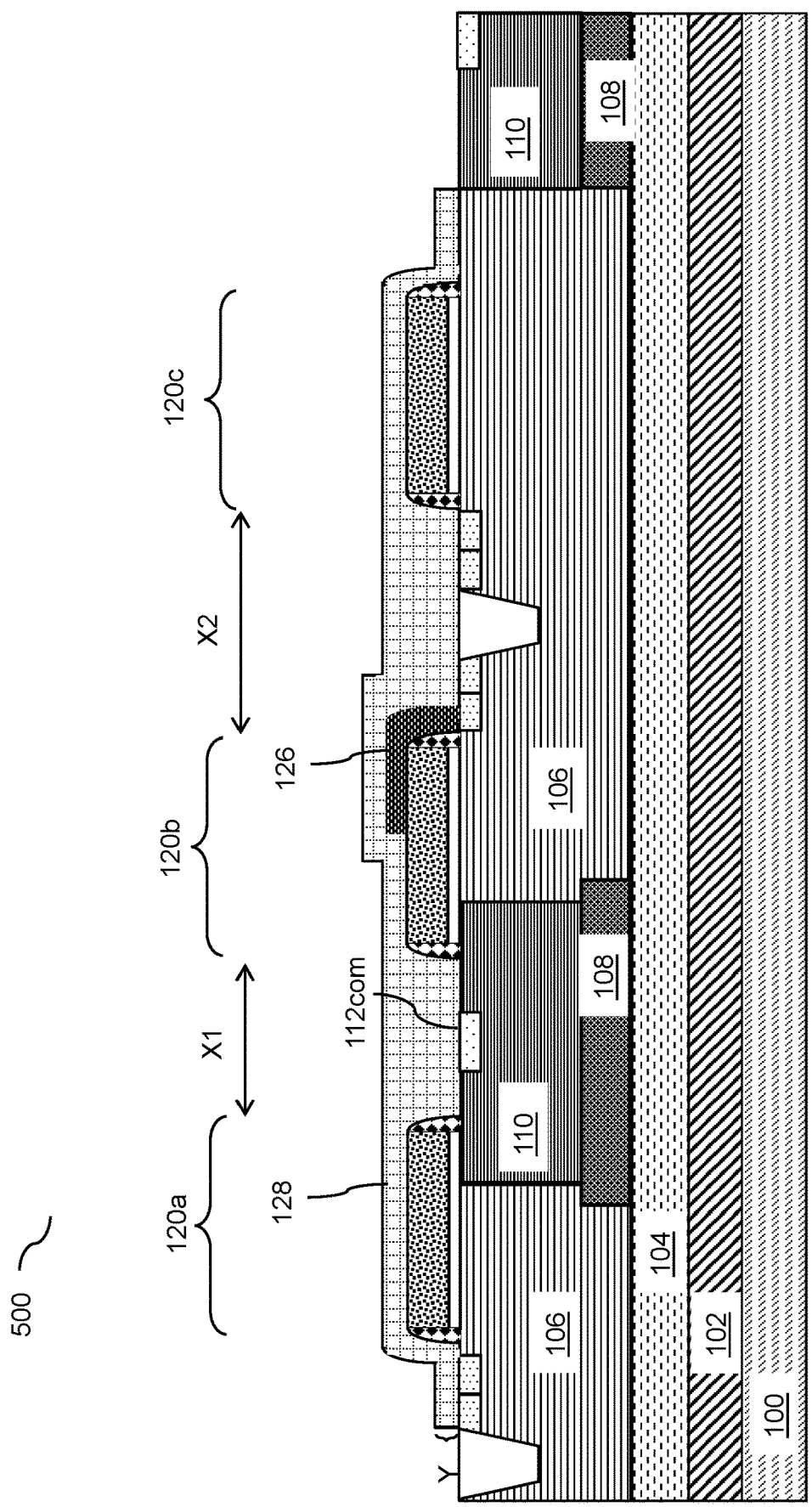
FIG. 12B is a vertical cross-sectional view illustrating an integrated semiconductor device with three transistors, an RPO layer and a first dielectric layer according to an alternative embodiment of the present disclosure

Referring to FIG. 12B, the alternative embodiment of FIG. 12A is illustrated with a metal field plate bottom dielectric layer 128 formed over the three adjacent transistors 120a, 120b, and 120c. In a manner similar to the operations shown in FIG. 4 above, a resist protect oxide (RPO) 126 may be formed over a portion of the gate 124b of second transistor 120b, the sidewall spacers 122b and a portion of the p-type regions 106. The RPO layer 126 may be formed by depositing a layer of oxide material, such as $SiO_2$ or any suitable oxide and then patterning the oxide layer such that the remaining oxide material covers a portion of the second transistor 120b and the p-type region 106. Typically, the RPO layer 126 may be deposited prior to siliciding. The portion of the intermediate device covered by the RPO layer 126 may be protected from siliciding by the RPO layer 126 during the siliciding process. The RPO layer 126 may be formed by chemical vapor deposition, plasma enhanced chemical vapor deposition, atomic layer deposition or any other suitable method. In addition, in a manner similar to the operations shown in FIGS. 5 and 6 above, a metal field plate bottom dielectric layer 128 may be deposited over the transistors 120a, 120b, 120c. The metal field plate bottom dielectric layer 128 may be made of any suitable dielectric material, such as $SiO_2$, SiC, SiON, SiN, boro-phospho-silicate Glass (BPSG), PSG (phosphosilicate glass; phosphorus doped silicon glass), TEOS (tetraethoxysilane; tetraethylorthosilicate; tetraethylorthosilicate; tetrethoxysilicide), and/or combinations thereof. The metal field plate bottom dielectric layer 128 may be formed by chemical vapor deposition, plasma enhanced chemical vapor deposition, atomic layer deposition or any other suitable method.

As discussed above with reference to FIG. 6, the metal field plate bottom dielectric layer 128 may be etched to a thickness Y. In order to account for all adjacent transistors, the distances $X_1$ and $X_2$ may be considered such that the thickness Y of the etched metal field plate bottom dielectric layer 128 is greater than of equal to half of the greater distance. In the example illustrated in FIG. 12B, the distance $X_2$ is greater than the distance $X_1$. Thus, the thickness Y of the etched metal field plate bottom dielectric layer 128 is greater than or equal to half of $X_2$ (i.e., $Y \geq X_2/2$). While FIGS. 12A and 12B illustrate distance $X_2$ to be greater than $X_1$, this illustration in not intended to be limiting. In other embodiments, the distance $X_1$ to be greater than $X_2$. In such embodiments, the thickness Y of the etched metal field plate bottom dielectric layer 128 is greater than or equal to half of $X_1$ (i.e., $Y \geq X_1/2$).

Figure 13:
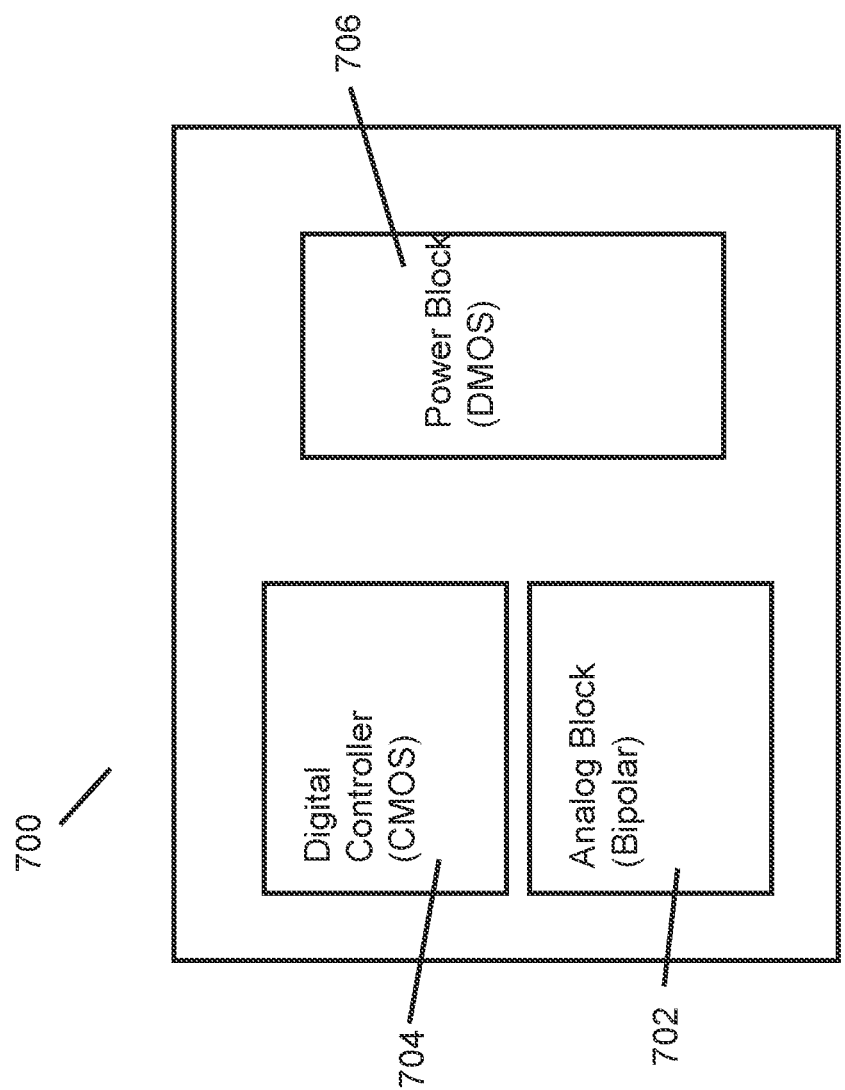
FIG. 13 is a plan view illustrating an integrated semiconductor BCD device according to an alternative embodiment of the present disclosure.

Referring to FIG. 13, another alternative integrated semiconductor device 700 is illustrated. In this embodiment, the integrated semiconductor device 700 may be a BCD. As illustrated in FIG. 13, the integrated semiconductor device 700 includes an analog region 702 with BJTs, a digital controller region 704 with CMOS transistors and a power region 706 with DMOS transistors. In various embodiments, the DMOS transistors of the power region 706 may include high voltage applications that may benefit from the additional application of metal field plates as discussed in any of the embodiments above. In other embodiments, the CMOS transistors of the digital controller region 704 may include metal field plates as discussed in any of the embodiments above. Alternatively, the DMOS transistors of the power region 706 and the CMOS transistors of the digital controller region 704 include metal field plates as discussed in any of the embodiments above.

Figure 14:
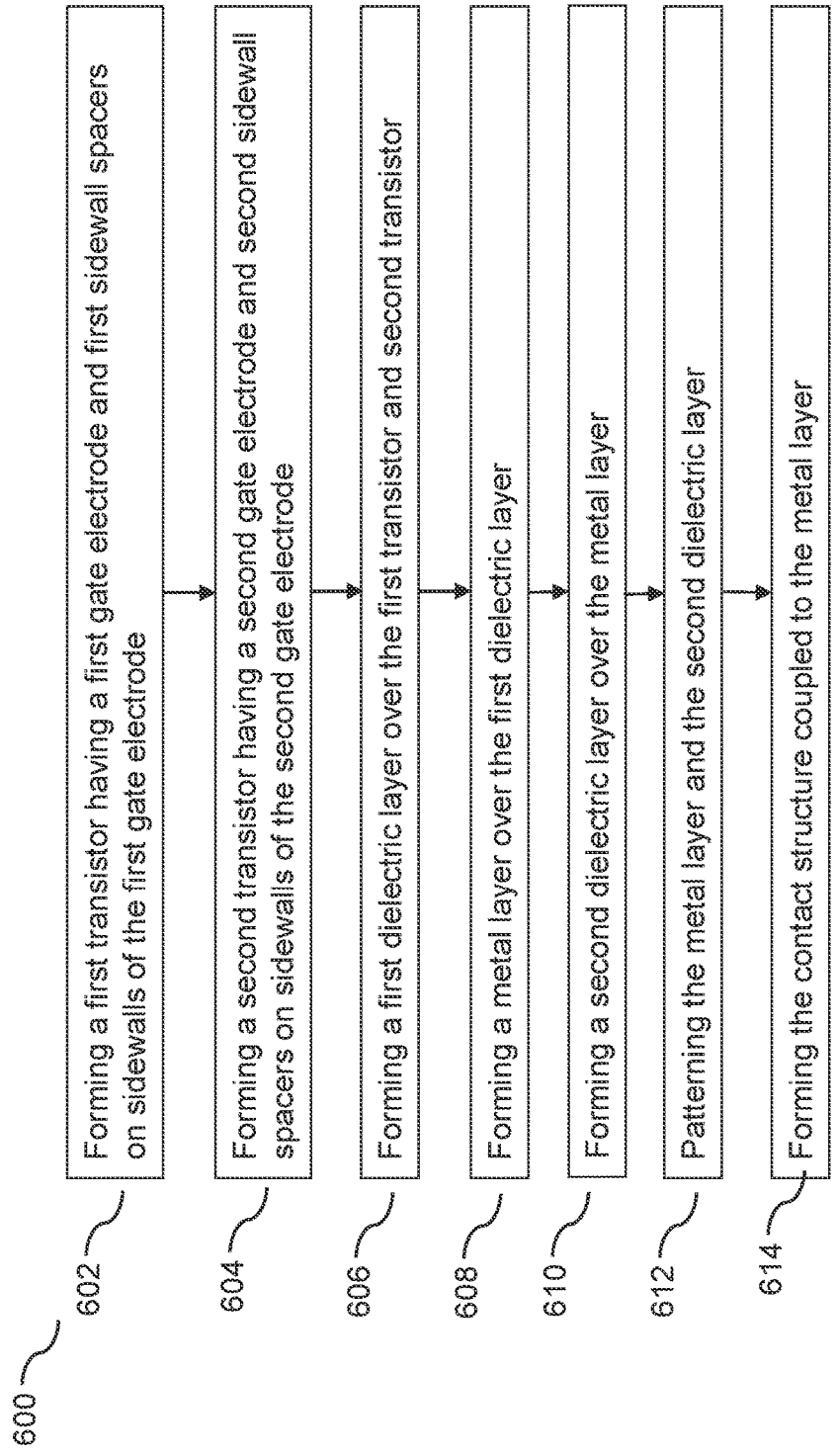
FIG. 14 is a flowchart that illustrates the general processing steps of the methods of the present disclosure.

FIG. 14 illustrates a general method 600 of making an integrated semiconductor device 200, 300, 400, 500. Referring to FIG. 14, the method 600 includes a step 602 of forming a first transistor 120a having a first gate 124a and first sidewall spacers 122a on sidewalls of the first gate 124a. Referring to step 604, the method 600 includes forming a second transistor 120b adjacent to the first transistor 120a, the second transistor 120b having a second gate 124b and second sidewall spacers 122b on sidewalls of the second gate 124b, wherein the second transistor 120b may formed a first distance $X_1$ from the first transistor 120a as measured from the first sidewall spacers 122a to the second sidewall spacers 122b. Referring to step 606, the method 600 includes forming first dielectric layer 128 over the first transistor 120a and second transistors 120b, wherein forming the first dielectric layer 128 may include depositing the first dielectric layer 128 over the first transistor 120a and second transistors 120b and etching the first dielectric layer 128 such that the thickness of the first dielectric layer Y is greater than the half the first distance $X_1$. Referring to step 608, the method 600 includes depositing a metal layer 134 over the first dielectric layer 128. Referring to step 610, the method 600 includes depositing a second dielectric layer 136 over the patterned metal layer 134. Referring to step 612, the method 600 includes patterning the metal layer 134 and the second dielectric layer 136. Referring to step 614, the method 600 further includes forming a contact structure 142v connected to the metal layer 134.

Embodiments disclosed herein are directed to integrated semiconductor devices 200, 300, 400, 500 and specifically to integrated semiconductor devices 200, 300, 400, 500 which include metal field plates. Embodiments include, but are not limited to, Bipolar/CMOS/DMOS (BCD) devices. In various embodiments, the thickness Y of a dielectric layer 128 located over adjacent transistors 120a, 120b may be more than half the distance X between the adjacent transistors. In various embodiments, the addition of the metal field plates and control of the distance between adjacent transistors 120a, 120b, 120c results in lowering the "on" resistance by 15-35% relative to similar device lacking metal field plates. The lower on resistance may result in lower power consumption as well as allowing for smaller device pitch. Smaller device pitch may result in a smaller chip size for the same number of devices on a chip. In various embodiments, the transistors may comprise FinFETs.

With reference to FIGS. 1-13, various embodiments provide an integrated semiconductor device 200, 300, 400, 500. The integrated semiconductor device may include: a first transistor 120a that includes a first gate 124a and at least one first active region 112com, 114a; a second transistor 120b comprising a second gate 124b and at least one second active region 112com, 114b, wherein the second transistor 120b is spaced a first distance $X_1$ from the first transistor 120a; a dielectric sidewall spacer 122a, 122b formed on a gate sidewall of the first transistor 120a and a gate sidewall of the second transistor 120b; a first dielectric layer 128 formed over the first transistor 120a and the second transistor 120b, wherein a thickness of the first dielectric layer 128 is greater than half the first distance $X_1$; and a patterned metal layer 134 formed on the first dielectric layer 128 and partially covering the second gate 124b.

In another embodiment, the first distance $X_1$ is measured between the dielectric sidewall spacers 122a, 122b formed on the gate sidewall of the first transistor 120a and the gate sidewall of the second transistor 120b. In another embodiment, the integrated semiconductor device 200, 300, 400, 500 may further include a resist protect oxide 126 formed over a portion of the second transistor 120b and partially covering the second gate 124b. In another embodiment, the patterned metal layer 134 partially covers the second gate 124b. In another embodiment, the integrated semiconductor device 200, 300, 400, 500 may further include a contact via structure 142v coupled to the patterned metal layer 134.

In another embodiment, the integrated semiconductor device 200, 300, 400, 500 may further include a third transistor 120c comprising a third gate 124c, and at least one third active region 114c, wherein the at least one dielectric sidewall spacer 122c is formed on a gate sidewall of the third transistor 120c, and the first dielectric layer 128 is formed on the first transistor 120a, the second transistor 120b and the third transistor 120c; and a second distance $X_2$ located between the second transistor 120b and the third transistor 120c measured from the at least one dielectric sidewall spacer 122c formed on the gate sidewall of the third transistor 120c, wherein the second distance $X_2$ is less than the first distance $X_1$.

In another embodiment, at least one of the first transistor, the second transistor, or the third transistor is a FinFET. In another embodiment, the at least one first active region comprises a high voltage well.

With reference to FIGS. 1-14, various embodiments provide a method for making an integrated semiconductor device. The method may include the operations of: forming a first transistor 120a having a first gate 124a and first sidewall spacers 122a on sidewalls of the first gate 124a; forming a second transistor 120b having a second gate 124b and second sidewall spacers 122b on sidewalls of the second gate 124b, wherein the second transistor 120b is spaced a first distance $X_1$ from the first transistor 120a measured from the first sidewall spacers 122a to the second sidewall spacers 122b; depositing a first dielectric layer 128 over the first transistor 120a and the second transistor 120b, wherein a thickness Y of the first dielectric layer 128 is greater than the half the first distance $X_1$; and forming a patterned metal layer 134 over the first dielectric layer 128.

In another embodiment, the method for making an integrated semiconductor device may include the operation of forming a resist protect layer 126 over the at least one second active region 112com, 114b associated with the second transistor 120b, wherein the resist protect layer 126 is formed between the second gate 124b and the first dielectric layer 128. In another embodiment, the operation of forming the first transistor 120a may include the operation of forming one of a metal oxide semiconductor field effect transistor (MOSFET), a fin field effect transistor (FinFET), a bipolar junction transistor (BJT) or a double diffused metal oxide semiconductor transistor (DMOS).

In another embodiment, the method for making an integrated semiconductor device may further include forming second dielectric layer 136 over the patterned metal layer 134, wherein forming the patterned metal layer 134 and forming the second dielectric layer 136 may include the operations of: depositing a continuous patterned metal layer 134L and a continuous second dielectric layer 136L; and patterning the continuous metal layer 134L and the continuous second dielectric layer 136L to form a patterned metal layer 134 and a patterned second dielectric layer 136 such that the patterned metal layer 134 and a patterned second dielectric layer 136 partially cover the second gate 124b.

In another embodiment, the patterned metal layer 134 and the patterned second dielectric layer 136 partially cover the at least one second active region 112com, 114b associated with the second transistor 120b. In another embodiment, patterning the continuous metal layer 134L and the continuous second dielectric layer 136L removes all of the continuous metal layer 134L located between the first transistor 120a and the second transistor 120b.

In another embodiment, the method for making an integrated semiconductor device may include the operation of forming a third transistor 120c having a third gate 124c and third sidewall spacers 122c on sidewalls of the third gate 124c, wherein the third transistor 120c is spaced a second distance $X_2$ from the second transistor 120b measured from the second sidewall spacers 122b to the third sidewall spacers 122c. In another embodiment, the integrated semiconductor device may include a bipolar-CMOS-DMOS (BCD) device.

With reference to FIGS. 1-13, various embodiments provide a bipolar-CMOS-DMOS (BCD) device 700. The bipolar-CMOS-DMOS (BCD) device 700 may include: an analog region 702 comprising at least one bipolar junction transistor (BJT); a digital controller region 704 comprising at least one complementary metal oxide semiconductor (CMOS) transistor; a power block 706 region comprising at least one double diffused metal oxide semiconductor (DMOS) transistor that is formed adjacent to the CMOS transistor; a first resist protect oxide 126 formed over a first active region of the CMOS transistor; a first dielectric layer 128 formed on at least the CMOS transistor and the DMOS transistors, wherein a thickness Y of the first dielectric layer 128 is greater than half a distance $X_1$ between the adjacent CMOS transistor and DMOS transistor; and a patterned metal layer 134 formed on the first dielectric layer 128 and partially covering the first active region of the CMOS transistor.

In one embodiment, the CMOS transistor comprises a fin field effect transistor (FinFET). In one embodiment, the bipolar-CMOS-DMOS (BCD) device 700 may further include a second dielectric layer 136 located on the patterned metal layer 134 and a contact etch stop layer 140 formed over the first dielectric layer 128 and the second dielectric layer 136.

In one embodiment, the contact etch stop layer 140 is formed directly on the first dielectric layer 128 between the adjacent CMOS transistor and DMOS transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated semiconductor device comprising:
    a first transistor comprising a first transistor gate, a first transistor gate first side, a first transistor gate second side, and at least one first transistor active region;
    a second transistor comprising a second transistor gate, at least one second transistor active region, a second transistor gate first side, and a second transistor gate second side facing the first transistor gate first side, wherein a first sidewall dielectric spacer disposed on the first transistor gate first side and substantially parallel to the first transistor gate first side is spaced a first distance from a second sidewall dielectric spacer disposed on the second transistor gate second side and substantially parallel to the second transistor gate second side;
    a first dielectric layer formed over the first transistor and the second transistor, wherein a thickness of the first dielectric layer is greater than half the first distance;
    a resist protect oxide formed over a portion of the second transistor and partially covering the second transistor gate;
    a patterned metal layer formed on the first dielectric layer and partially covering the second transistor gate; and
    a second dielectric layer formed over the first transistor and the second transistor and formed over the patterned metal layer.

2. The integrated semiconductor device of claim 1, wherein the first sidewall dielectric spacer extends perpendicular to a main extension direction of the first transistor gate and the second sidewall dielectric spacer extends perpendicular to a main extension direction of the second transistor gate.

3. The integrated semiconductor device of claim 2, further comprising:
    a third transistor comprising a third transistor gate, at least one third transistor active region, and a third transistor gate first side facing the second transistor gate first side, wherein a dielectric sidewall spacer is formed on the third transistor gate first side, and wherein the first dielectric layer is formed on the first transistor, the second transistor and the third transistor; and
    a second distance measured between a sidewall dielectric spacer of the second transistor first side and the dielectric sidewall spacer on the third transistor gate first side of the third transistor, wherein the second distance is less than the first distance.

4. The integrated semiconductor device of claim 3, wherein at least one of the first transistor, the second transistor, or the third transistor is a FinFET.

5. The integrated semiconductor device of claim 1, wherein the resist protect oxide is formed over the second sidewall dielectric spacer, and wherein the resist protect oxide is formed between a portion of the at least one second transistor active region and the first dielectric layer.

6. The integrated semiconductor device of claim 1, further comprising a contact via structure coupled to the patterned metal layer.

7. The integrated semiconductor device of claim 1, wherein the at least one first active region comprises a high voltage well.

8. A device structure comprising:
a first transistor having a first transistor gate, first sidewall spacers on sidewalls of the first transistor gate, the sidewalls being perpendicular to a main extension direction of the first transistor gate, and a first side disposed on one of the first sidewall spacers;
a second transistor having a second transistor gate, second sidewall spacers on sidewalls of the second transistor gate, the sidewalls being perpendicular to a main extension direction of the second transistor gate, and a second side disposed on one of the second sidewall spacers and facing the first side, the second side being spaced a first distance from the first side;
a first dielectric layer disposed on the first transistor and the second transistor, a thickness of the first dielectric layer being greater than half the first distance;
a resist protect oxide formed over a portion of the second transistor and partially covering the second transistor gate;
a patterned metal layer disposed on the first dielectric layer and partially covering the second transistor gate; and
a second dielectric layer formed over the first transistor and the second transistor and formed over the patterned metal layer.

9. The device structure of claim 8,
wherein the resist protect layer is disposed on at least one second transistor active region associated with the second transistor, the resist protect layer is disposed between the second transistor gate and the first dielectric layer.

10. The device structure of claim 9, wherein the first transistor is one of a metal oxide semiconductor field effect transistor (MOSFET), a fin field effect transistor (FinFET), a bipolar junction transistor (BJT), or a double diffused metal oxide semiconductor transistor (DMOS).

11. The device structure of claim 8, further comprising:
a third transistor having a third transistor gate and a third side disposed on one of the third sidewall spacers formed on sidewalls of the third transistor gate, the sidewalls being perpendicular to a main extension direction of the third transistor gate,
wherein the third side is spaced a second distance from another side of the second transistor disposed on the second sidewall spacers of the second transistor and facing the third side,
wherein the second distance is less than the first distance.

12. The device structure of claim 8, wherein the patterned metal layer is continuous.

13. The device structure of claim 8, further comprising:
a second dielectric layer disposed on the patterned metal layer,
wherein the second dielectric layer is a patterned dielectric layer,
wherein the patterned metal layer and the patterned second dielectric layer partially cover the second transistor gate, and
wherein the patterned metal layer and the patterned second dielectric layer partially cover the at least one second active region associated with the second transistor.

14. The device structure of claim 8, further comprising:
an oxide layer disposed on the first transistor and the second transistor covering the first dielectric layer and the patterned metal layer forming a planar surface extending over the first transistor and the second transistor.

15. The device structure of claim 8, further comprising:
a second dielectric layer formed over the first transistor and the second transistor and covering at least a portion of the first dielectric layer and the patterned metal layer.

16. The device structure of claim 8, wherein the first dielectric layer substantially fills a space formed by the first transistor and the second transistor being spaced apart by the first distance.

17. The device structure of claim 8, further comprising:
a common contact disposed between the first transistor and the second transistor.

18. The device structure of claim 17, wherein the first dielectric layer directly contacts the common contact.

19. A device structure comprising:
a first transistor having a first transistor gate, first sidewall spacers on sidewalls of the first transistor gate, the sidewalls being perpendicular to a main extension direction of the first transistor gate, and a first side disposed on one of the first sidewall spacers;
a second transistor having a second transistor gate, second sidewall spacers on sidewalls of the second transistor gate, the sidewalls being perpendicular to a main extension direction of the second transistor gate, and a second side disposed on one of the second sidewall spacers and facing the first side, the second side being spaced a first distance from the first side;
a first dielectric layer disposed on the first transistor and the second transistor, a thickness of the first dielectric layer being greater than half the first distance;
a resist protect oxide formed over a portion of the second transistor and partially covering the second transistor gate;
a patterned metal layer disposed on the first dielectric layer and partially covering the second transistor gate;
a second dielectric layer disposed on the patterned metal layer,
wherein the second dielectric layer is a patterned dielectric layer, and
wherein the patterned metal layer and the patterned second dielectric layer partially cover the second transistor gate.

20. The device structure of claim 19, wherein the second dielectric layer is continuous.

* * * * *